US009431452B1

(12) United States Patent
Liu et al.

(10) Patent No.: US 9,431,452 B1
(45) Date of Patent: Aug. 30, 2016

(54) BACK SIDE ILLUMINATED IMAGE SENSOR PIXEL WITH DIELECTRIC LAYER REFLECTING RING

(71) Applicant: OMNIVISION TECHNOLOGIES, INC., Santa Clara, CA (US)

(72) Inventors: Chia-Ying Liu, Hsinchu (TW); Chih-Wei Hsiung, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/711,575

(22) Filed: May 13, 2015

(51) Int. Cl.
*H01L 31/062* (2012.01)
*H01L 31/113* (2006.01)
*H01L 27/146* (2006.01)

(52) U.S. Cl.
CPC ..... *H01L 27/14645* (2013.01); *H01L 27/1463* (2013.01); *H01L 27/1464* (2013.01); *H01L 27/14612* (2013.01); *H01L 27/14621* (2013.01); *H01L 27/14627* (2013.01); *H01L 27/14629* (2013.01)

(58) Field of Classification Search
CPC ............. H01L 27/14645; H01L 27/14612; H01L 27/14621; H01L 27/14627; H01L 27/14629; H01L 27/1463; H01L 27/1464
USPC ........................................................ 257/292
See application file for complete search history.

(56) References Cited

U.S. PATENT DOCUMENTS

| 7,989,859 | B2 | 8/2011 | Mao et al. | |
|---|---|---|---|---|
| 2011/0037134 | A1* | 2/2011 | Sugino | H01L 27/14605 257/432 |
| 2013/0134535 | A1* | 5/2013 | Lenchenkov | H01L 27/14627 257/432 |
| 2013/0307040 | A1* | 11/2013 | Ahn | H01L 27/1463 257/292 |

OTHER PUBLICATIONS

U.S. Appl. No. 14/606,416, filed Jan. 27, 2015, Yuanwei Zheng.

* cited by examiner

*Primary Examiner* — Robert Huber
(74) *Attorney, Agent, or Firm* — Blakely Sokoloff Taylor & Zafman LLP

(57) ABSTRACT

An image sensor includes a photodiode proximate to a front side of semiconductor material to accumulate image charge. A metal layer reflector structure is disposed in a dielectric layer proximate to the front side of the semiconductor material. A contact reflecting ring structure is disposed in the dielectric layer between the metal layer reflector structure and a contact etch stop layer disposed over the front side of the semiconductor material. The contact reflecting ring structure defines a portion of a light guide in the dielectric layer such that light that is directed through a back side of the semiconductor material, through the photodiode, and reflected from the metal layer reflector structure back through the photodiode is confined to remain within an interior of the contact reflecting ring structure when passing through the dielectric layer between the photodiode and the metal layer reflector structure.

21 Claims, 3 Drawing Sheets

BACK SIDE ILLUMINATED IMAGE SENSOR PIXEL WITH DIELECTRIC LAYER REFLECTING RING

BACKGROUND INFORMATION

1. Field of the Disclosure

The present invention is generally related to image sensors, and more specifically, the present invention is directed to near infrared image sensors.

2. Background

Image sensors have become ubiquitous. They are widely used in digital still cameras, cellular phones, security cameras, as well as, medical, automobile, and other applications. The technology used to manufacture image sensors, and in particular, complementary metal-oxide-semiconductor (CMOS) image sensors (CIS), has continued to advance at a great pace. For example, the demands for higher resolution and lower power consumption have encouraged the further miniaturization and integration of these image sensors.

Two fields of applications in which size and image quality are particularly important are security and automotive applications. For these applications, the image sensor chip must typically provide a high quality image in the visible light spectrum as well as have improved sensitivity, quantum efficiency, and reduced crosstalk, especially in the red and near infrared portions of the light spectrum.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
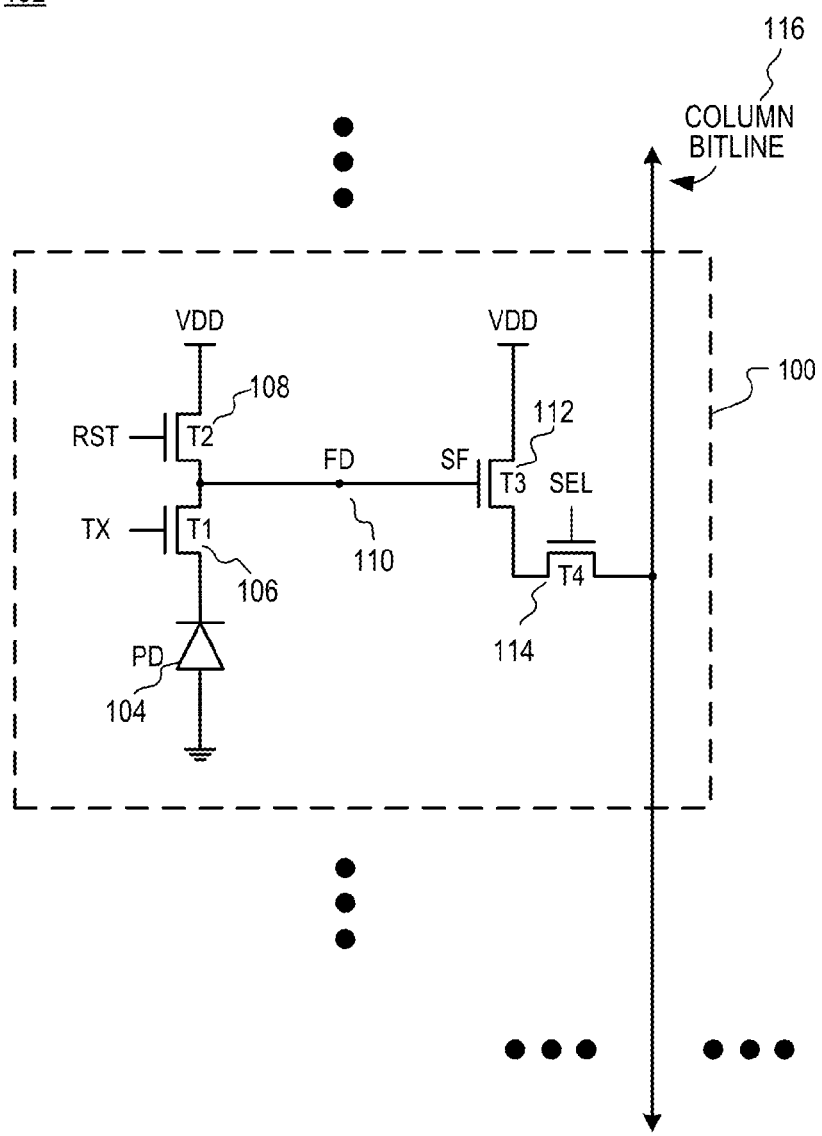
FIG. 1 is a schematic illustrating one example of pixel cell that may be included in an example enhanced back side illuminated near infrared image sensor in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

In a typical back side illuminated (BSI) image sensor, a significant portion of the red or near infrared light, such as for example light having a longer wavelength of approximately 850 nm, that enters the back side of the semiconductor material, such as for example silicon, propagates through the semiconductor material without being absorbed. Thus, thicker silicon is needed in order to absorb more of the incident red or near infrared light. However, the semiconductor material of a typical back side illuminated image sensor is typically thinned in order to improve visible light performance, which degrades the red or near infrared performance of the image sensor.

Thus, as will be describe below, an example back side illuminated image sensor in accordance with the teaching of the present invention features a light reflecting cylinder type shape that is added to the front side behind the photodiode of a pixel cell in combination with a reflector to confine the longer wavelength red and near infrared light from leaking between pixel cells and results in more light to be reflected back into the photodiode to be absorbed, which therefore improves red or near infrared sensitivity, as well as reduces optical crosstalk in an image sensor in accordance with the teachings of the present invention. For instance, in one example, metal layer reflectors are positioned in the dielectric layer behind the photodiodes. In the example, a contact reflecting ring structure is positioned under the pixel front side metal layer reflector to prevent light loss and crosstalk through the contact dielectric. In one example, the contact reflecting ring structure may be formed during the contact etch process and uses the contact etch stop layer to prevent the contact reflecting ring structure from reaching the semiconductor substrate of the pixel cell. In one example, the trenches formed during the contact etch process may be filled with a light reflecting material, such as for example tungsten, to form the contact reflecting ring structure, which confines the light to remain within the pixel cell to improve quantum efficiency and prevent light from straying into neighboring pixel cells through the dielectric layer in accordance with the teachings of the present invention.

To illustrate, FIG. 1 is a schematic illustrating one example of pixel cell 100 that may be included in an example enhanced back side illuminated near infrared image sensor 102 in accordance with the teachings of the present invention. In the depicted example, pixel cell 100 is illustrated as being a four-transistor ("4T") pixel cell included in image sensor 102 in accordance with the teachings of the invention. It is appreciated that pixel cell 100 is one possible example of pixel circuitry architecture for implementing each pixel cell within the pixel array of image sensor 102 of FIG. 1. However, it should be appreciated that other examples in accordance with the teachings of the present invention are not necessarily limited to 4T pixel architectures. One having ordinary skill in the art having the benefit of the present disclosure will understand that the present teachings are also applicable to 3T designs, 5T designs, and various other pixel architectures in accordance with the teachings of the present invention.

In the example depicted in FIG. 1, pixel cell 100 includes a photodiode ("PD") 104 to accumulate image charge, a transfer transistor T1 106, a reset transistor T2 108, a floating diffusion ("FD") 110, a source-follower ("SF") transistor T3 112, and a select transistor T4 114. During operation, transfer transistor T1 106 receives a transfer signal TX, which transfers the image charge accumulated in photodiode PD 104 to floating diffusion FD 110. In one example, floating diffusion FD 110 may be coupled to a storage capacitor for temporarily storing image charges. In one example and as will be discussed in further detail below, a contact ring reflecting structure is formed in the dielectric layer between a metal layer reflector in the dielectric layer and the photodiode 104 to confine light to remain within the pixel cell 100 in accordance with the teachings of the present invention. As such, improved red or near infrared sensitivity, as well as reduced optical crosstalk is provided in accordance with the teachings of the present invention. As shown in the illustrated example, reset transistor T2 108 is coupled between a power rail VDD and the floating diffusion FD 110 to reset the pixel cell 100 (e.g., discharge or charge the floating diffusion FD 110 and the photodiode PD 104 to a preset voltage) in response to a reset signal RST. The floating diffusion FD 110 is coupled to control the gate of SF transistor T3. SF transistor T3 is coupled between the power rail VDD and select transistor T4. SF transistor T3 operates as a source-follower amplifier providing a high impedance connection to the floating diffusion FD 110. Select transistor T4 114 selectively couples the output of pixel cell 100 to the readout column bitline 116 in response to a select signal SEL.

In one example, the TX signal, the RST signal, the SEL signal, and the readout pulse voltage, are generated by control circuitry, an example of which will be described in further detail below. In an example in which image sensor 102 operates with a global shutter, the global shutter signal is coupled to the gate of each transfer transistor T1 106 in the image sensor 102 to simultaneously commence charge transfer from each pixel's photodiode PD 104. Alternatively, rolling shutter signals may be applied to groups of transfer transistors T1 106 in accordance with the teachings of the present invention.

Figure 2:
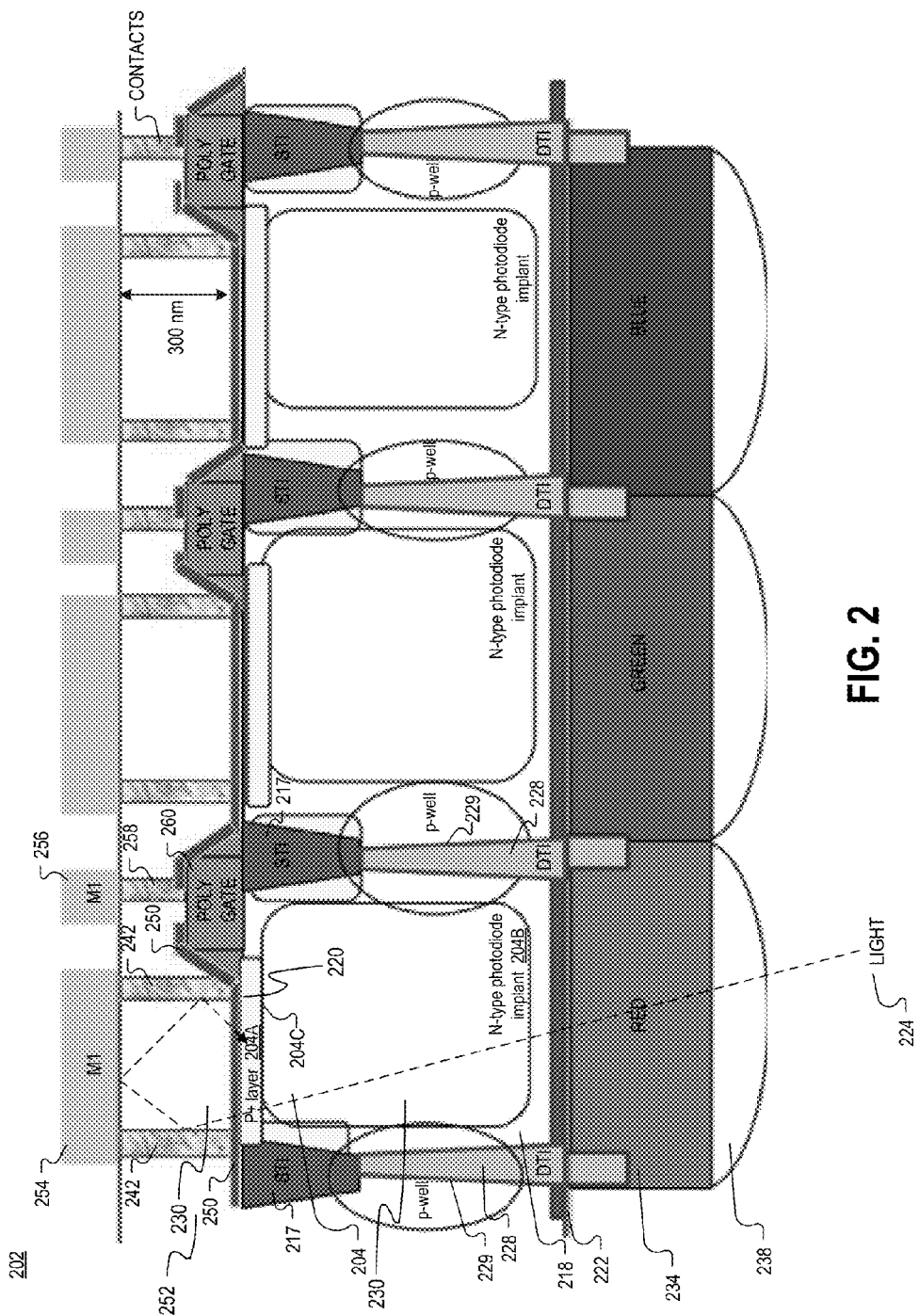
FIG. 2 is a cross-section view illustrating a cross-section view of a portion of one example of an example enhanced back side illuminated near infrared image sensor in accordance with the teachings of the present invention.

FIG. 2 is a cross-section view illustrating a cross-section view of a portion of one example of an example enhanced back side illuminated near infrared image sensor chip 202 in accordance with the teachings of the present invention. It is appreciated that image sensor chip 202 of FIG. 2 may be one example of an implementation of image sensor 102 of FIG. 1 and that similarly named and numbered elements referenced below are coupled and function similar to as described above. It is noted that other circuit elements of image sensor 102 shown in FIG. 1, such as for example various transistors and their associated diffusions and doped regions are not shown in detail in FIG. 2 so as not obscure the teachings of the present invention.

Referring back to the example illustrated FIG. 2, image sensor chip 202 includes a photodiode 204 disposed in a layer of semiconductor material 218 proximate to a front side 220 of the image sensor chip 202 to accumulate image charge in response to light 224, which is directed into the semiconductor material 218 through a back side 222 of the semiconductor material 218 and through the photodiode 204 as shown. In the depicted example, photodiode 204 includes a pn junction 204C, which is formed at an interface between a P+ layer 204A and an N-type photodiode implant 204B. In one example, semiconductor material 218 includes silicon, polysilicon, or another suitable semiconductor material. In one example, semiconductor material 218 is also thinned in order provide improved visible light performance of image sensor chip 202. In one example, light 224 includes red or near infrared light. For instance, in one example, light 224 may have a wavelength of approximately 850 nm.

In one example, image sensor chip 202 includes a metal layer (M1) reflector structure 254 disposed in a dielectric layer 252 proximate to the front side 220 of the semiconductor material 218 such that the light 224 that is directed through the back side 222 of the semiconductor material 218 and through the photodiode 204 is reflected from the metal layer reflector structure 254 back through the photodiode 204. As shown in the example, a contact etch stop layer 250 is disposed over the front side 220 of the semiconductor material 218 between the dielectric layer 252 and the photodiode 204 in the semiconductor material 218.

In one example, image sensor chip 202 includes a contact reflecting ring structure 242 disposed in the dielectric layer 252 between the metal layer reflector structure 254 and the contact etch stop layer 250. In one example, contact reflecting ring structure 242 has a cylinder type shape and reflects incident light 224, which confines light 224 from leaking between pixel cells in accordance with the teachings of the present invention. As shown in the example, the contact reflecting ring structure 242 encloses or defines a portion of an optical waveguide or light guide 230 in the dielectric layer 252 between the metal layer reflector structure 254 and the photodiode 204. As such, the light 224 that is directed through semiconductor material 218 and photodiode 204 is reflected back from the metal layer reflector structure 254, and is confined to remain within an interior of the contact reflecting ring structure 242 when passing through the dielectric layer 252 between the photodiode 204 and the metal layer reflector structure 254 in accordance with the teachings of the present invention.

In one example, contact reflecting ring structure 242 is formed in the dielectric layer 252 in a trench that was etched during contact etch processing of image sensor chip 202. As shown in the example, the trench is filled with a reflective material to form contact reflecting ring structure 242 between the metal layer reflector 254 and the contact etch stop layer 250. In one example, the reflective material used to form contact reflecting ring structure 242 includes tungsten. Contact etch stop layer 250 prevents the etching of the trench used for contact reflecting ring structure 242 from reaching the semiconductor substrate 218 and photodiode 204. In one example, it is appreciated that the trench for contact reflecting ring structure 242 may be etched at the same time, and may be filled with the same materials (e.g., tungsten) as other contacts that are formed in image sensor chip 202.

For instance, in the depicted example, image sensor chip 202 also includes a gate structure 260 disposed over the front side 220 of the semiconductor material 218 proximate to the photodiode 204 as shown. In one example, gate structure 260 is made of polysilicon or other suitable conductive material. In the example, a contact 258 is coupled between a gate structure 260 and a metal conductor 256 disposed in the dielectric layer 252. In one example, the contact 258 is formed in the dielectric layer 252 in a trench that was also etched during the contact etch processing of image sensor chip 202 between the metal conductor 256 and the gate structure 260 at the same time as the trench for contact reflecting ring structure 242 was etched. In one example, the trench for contact 258 is also filled with a conductive material, such as for example tungsten.

In one example, image sensor chip 202 may also include shallow trench isolation structures 217 disposed in the semiconductor material 218 proximate to the photodiode 204 to isolate the photodiode 204 in the semiconductor material 218. As shown in the depicted example, the shallow trench isolation structures 217 extend from the front side 220 of the semiconductor material 218 toward the back side 222 of the semiconductor material 218. In one example, image sensor chip 202 may also include deep trench isolation (DTI) structures 228 that are disposed in the semiconductor material 218, which isolate the photodiodes 204 in the semiconductor material 218, as well as define a portion of the light guide 230 for light 224 to propagate through the semiconductor material 218 to the photodiode 204 as shown in accordance with the teachings of the present invention. In one example, there is a thin layer of dielectric material 229 disposed between each of the DTI structures 228 and the semiconductor material 218. In one example, each of the DTI structures 228 extend along a substantial portion of the light guide 230 through the semiconductor material 218 and extend from the back side 222 of the semiconductor material 218 to a corresponding one of the shallow trench isolation structures 217 in accordance with the teachings of the present invention. In one example, there are also P-wells disposed in semiconductor material 218 between the photodiodes 204 of image sensor chip 202.

In the example depicted in FIG. 2, image sensor chip 202 may also include a color filter array layer 234 disposed proximate to the back side 222 of the semiconductor material 218. In one example, the color filters in color filter array layer 234 include red, green, blue color filters. In one example, image sensor chip 202 may further include a microlens array 238 disposed proximate to the back side 222 of the semiconductor material 218 as shown.

Figure 3:
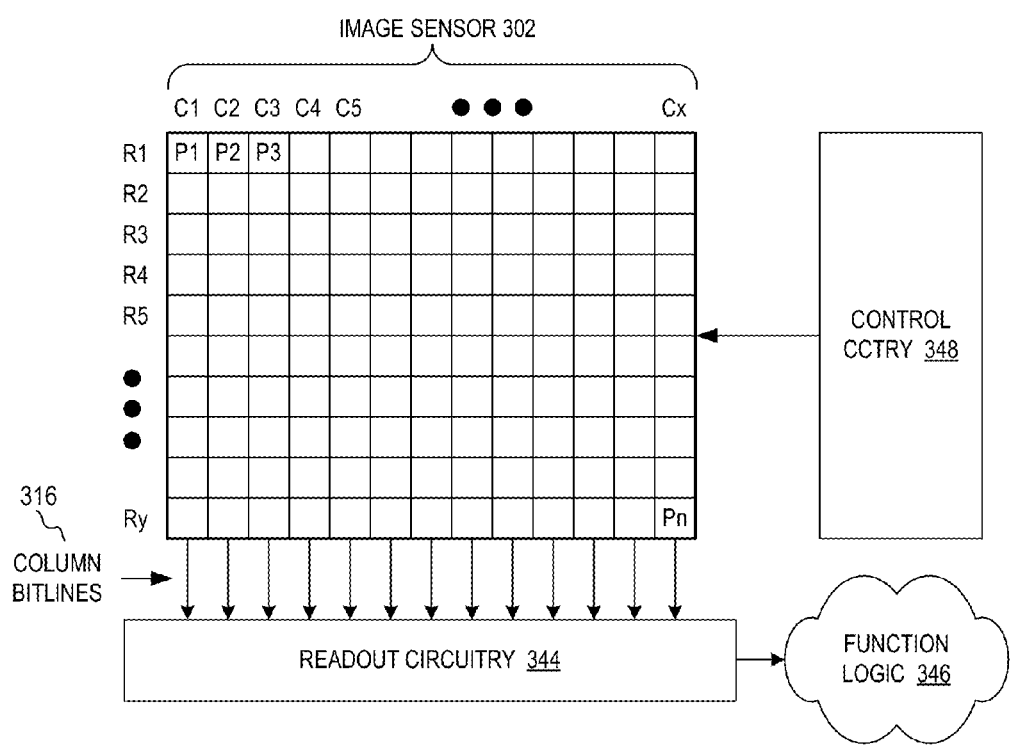
FIG. 3 is a diagram illustrating one example of an imaging system including an example enhanced back side illuminated near infrared image sensor including a pixel array in accordance with the teachings of the present invention.

FIG. 3 is a diagram illustrating one example of an imaging system 343 including an enhanced back side illuminated near infrared image sensor 302 in accordance with the teachings of the present invention. As shown in the depicted example, imaging system 343 includes image sensor 302 coupled to control circuitry 348 and readout circuitry 344, which is coupled to function logic 346.

In one example, image sensor 302 includes a pixel array that is a two-dimensional (2D) array of pixel cells (e.g., pixel cells P1, P2 Pn). In one example, each pixel cell is a CMOS imaging pixel. It is noted that the pixel cells P1, P2, Pn in image sensor 302 may be examples of pixel cell 100 of FIG. 1 and/or each pixel cell illustrated in image sensor 202 of FIG. 2, and that similarly named and numbered elements referenced below are coupled and function similar to as described above. As illustrated, each pixel cell is arranged into a row (e.g., rows R1 to Ry) and a column (e.g., column C1 to Cx) to acquire image data of a person, place, object, etc., which can then be used to render a 2D image of the person, place, object, etc.

In one example, after each pixel cell has accumulated its image data or image charge, the image data is readout by readout circuitry 344 through readout column bitlines 316 and then transferred to function logic 346. In various examples, readout circuitry 344 may include amplification circuitry, analog-to-digital (ADC) conversion circuitry, or otherwise. Function logic 346 may simply store the image data or even manipulate the image data by applying post image effects (e.g., crop, rotate, remove red eye, adjust brightness, adjust contrast, or otherwise). In one example, readout circuitry 344 may readout a row of image data at a time along readout column bitlines 316 (illustrated) or may readout the image data using a variety of other techniques (not illustrated), such as a serial readout or a full parallel readout of all pixels simultaneously.

In one example, control circuitry 348 is coupled to image sensor 302 to control operational characteristics of image sensor 302. For example, control circuitry 348 may generate a shutter signal for controlling image acquisition. In one example, the shutter signal is a global shutter signal for simultaneously enabling all pixels cells within image sensor 302 to simultaneously capture their respective image data during a single acquisition window. In another example, the shutter signal is a rolling shutter signal such that each row, column, or group of pixels is sequentially enabled during consecutive acquisition windows.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. An image sensor, comprising:
a photodiode disposed in semiconductor material proximate to a front side of the semiconductor material to accumulate image charge in response to light directed through a back side of the semiconductor material and through the photodiode;
a metal layer reflector structure disposed in a dielectric layer proximate to the front side of the semiconductor material such that the light that is directed through the back side of the semiconductor material and through the photodiode is reflected from the metal layer reflector structure back through the photodiode;
a contact etch stop layer disposed over the front side of the semiconductor material between the dielectric layer and the photodiode in the semiconductor material; and
a contact reflecting ring structure disposed in the dielectric layer, wherein all of the contacting reflecting ring structure is disposed between the metal layer reflector structure and the contact etch stop layer, wherein the contact reflecting ring structure encloses a portion of a light guide in the dielectric layer between the metal layer reflector structure and the photodiode in the semiconductor material such that the light that is directed through the photodiode and reflected from the metal layer reflector structure back through the photodiode is confined to remain within an interior of the contact reflecting ring structure when passing through the dielectric layer between the photodiode and the metal layer reflector structure.

2. The image sensor of claim 1 wherein the contact reflecting ring structure comprises a tungsten filled trench etched in the dielectric layer between the metal layer reflector structure and the contact etch stop layer.

3. The image sensor of claim 1 further comprising shallow trench isolation structures disposed in the semiconductor material proximate to the photodiode to isolate the photodiode in the semiconductor material, wherein the shallow trench isolation structures extend from the front side of the semiconductor material toward the back side of the semiconductor material.

4. The image sensor of claim 3 further comprising deep trench isolation structures disposed in the semiconductor material, wherein each one of the deep trench isolation structures extend from the back side of the semiconductor material to a corresponding one of the shallow trench isolation structure.

5. The image sensor of claim 4 wherein the light that is directed through the back side of the semiconductor material and through the photodiode is confined to remain between the deep trench isolation structures and between the shallow trench isolation structures when passing through the semiconductor material to the photodiode.

6. The image sensor of claim 3 further comprising dielectric material disposed between the deep trench isolation structures and the semiconductor material.

7. The image sensor of claim 1 further comprising a gate structure disposed over the front side of the semiconductor material proximate to the photodiode.

8. The image sensor of claim 7 further comprising a contact coupled between a gate structure and a metal conductor disposed in the dielectric layer.

9. The image sensor of claim 8 wherein the contact comprises a tungsten filled trench etched in the dielectric layer between the gate structure and the metal conductor disposed in the dielectric layer.

10. The image sensor of claim 1 wherein the photodiode includes a pn junction defined in the semiconductor material proximate to the front side of the semiconductor material.

11. The image sensor of claim 1 further comprising a color filter array layer disposed proximate to the back side of the semiconductor material.

12. The image sensor of claim 1 further comprising a microlens array disposed proximate to the back side of the semiconductor material.

13. An imaging system, comprising:
a pixel array having a plurality of pixel cells disposed in semiconductor material, wherein each one of the plurality of pixel cells includes:
a photodiode disposed in the semiconductor material proximate to a front side of the semiconductor material to accumulate image charge in response to light directed through a back side of the semiconductor material and through the photodiode;
a metal layer reflector structure disposed in a dielectric layer proximate to the front side of the semiconductor material such that the light that is directed through the back side of the semiconductor material and through the photodiode is reflected from the metal layer reflector structure back through the photodiode;
a contact etch stop layer disposed over the front side of the semiconductor material between the dielectric layer and the photodiode in the semiconductor material; and
a contact reflecting ring structure disposed in the dielectric layer, wherein all of the contacting reflecting ring structure is disposed between the metal layer reflector structure and the contact etch stop layer, wherein the contact reflecting ring structure encloses a portion of a light guide in the dielectric layer between the metal layer reflector structure and the photodiode in the semiconductor material such that the light that is directed through the photodiode and reflected from the metal layer reflector structure back through the photodiode is confined to remain within an interior of the contact reflecting ring structure when passing through the dielectric layer between the photodiode and the metal layer reflector structure;
control circuitry coupled to the pixel array to control operation of the pixel array; and
readout circuitry coupled to the pixel array to readout image data from the plurality of pixel cells.

14. The imaging system of claim 13 further comprising function logic coupled to the readout circuitry to store the image data readout from the plurality of pixel cells.

15. The imaging system of claim 13 wherein the contact reflecting ring structure comprises a tungsten filled trench etched in the dielectric layer between the metal layer reflector structure and the contact etch stop layer.

16. The imaging system of claim 13 wherein each one of the plurality of pixel cells further includes shallow trench isolation structures disposed in the semiconductor material proximate to the photodiode to isolate the photodiode in the semiconductor material, wherein the shallow trench isolation structures extend from the front side of the semiconductor material toward the back side of the semiconductor material.

17. The imaging system of claim 16 wherein each one of the plurality of pixel cells further includes deep trench isolation structures disposed in the semiconductor material, wherein each one of the deep trench isolation structures extend from the back side of the semiconductor material to a corresponding one of the shallow trench isolation structure.

18. The imaging system of claim 17 wherein the light that is directed through the back side of the semiconductor material and through the photodiode is confined to remain between the deep trench isolation structures and between the shallow trench isolation structures when passing through the semiconductor material to the photodiode.

19. The imaging system of claim 13 wherein each one of the plurality of pixel cells further includes a gate structure disposed over the front side of the semiconductor material proximate to the photodiode.

20. The imaging system of claim 19 wherein each one of the plurality of pixel cells further includes a contact coupled between a gate structure and a metal conductor disposed in the dielectric layer.

21. The imaging system of claim 20 wherein the contact comprises a tungsten filled trench etched in the dielectric layer between the gate structure and the metal conductor disposed in the dielectric layer.

* * * * *